(12) United States Patent
Lin et al.

(10) Patent No.: US 7,681,110 B2
(45) Date of Patent: Mar. 16, 2010

(54) DECODING TECHNIQUE FOR LINEAR BLOCK CODES

(75) Inventors: Zhouchen Lin, Beijing (CN); Qiang Wang, Beijing (CN); Chunhui Zhang, Beijing (CN)

(73) Assignee: Microsoft Corporation, Redmond, WA (US)

( * ) Notice: Subject to any disclaimer, the term of this patent is extended or adjusted under 35 U.S.C. 154(b) by 815 days.

(21) Appl. No.: 11/468,609

(22) Filed: Aug. 30, 2006

(65) Prior Publication Data
US 2008/0059867 A1 Mar. 6, 2008

(51) Int. Cl.
*H03M 13/00* (2006.01)
(52) U.S. Cl. ...................................... 714/785
(58) Field of Classification Search ............ 714/785
See application file for complete search history.

(56) References Cited

U.S. PATENT DOCUMENTS

| 4,623,999 | A | 11/1986 | Patterson |
| 4,635,262 | A | 1/1987 | Kittel |
| 5,600,659 | A | 2/1997 | Chen |
| 5,930,272 | A | 7/1999 | Thesling |
| 6,160,854 | A | 12/2000 | Heegard et al. |
| 6,260,169 | B1 * | 7/2001 | Massoudi ............... 714/769 |
| 6,732,325 | B1 | 5/2004 | Tash et al. |
| 6,986,092 | B2 | 1/2006 | Butler et al. |
| 2004/0128607 | A1 | 7/2004 | Sutskover |
| 2005/0193320 | A1 | 9/2005 | Varnica et al. |
| 2005/0210358 | A1 | 9/2005 | Chouly et al. |
| 2005/0229091 | A1 | 10/2005 | Narayanan et al. |
| 2006/0005110 | A1 * | 1/2006 | Nango et al. ............... 714/785 |

OTHER PUBLICATIONS

Kou, et al., "Low-Density Parity-Check Codes Based on Finite Geometries: A Rediscovery and New Results", IEEE Transactions on Information Theory, vol. 47, No. 7, Nov. 2001, pp. 2711-2736.
Mihaljevic, et al., "A Method for Convergence Analysis of Iterative Probabilistic Decoding", IEEE Transactions on Information Theory, vol. 46, No. 6, Sep. 2000, pp. 2206-2211.
Muder, "Minimal Trellises for Block Codes", IEEE Transactions on Information Theory, vol. 34, No. 5, Sep. 1988, pp. 1049-1053.

* cited by examiner

*Primary Examiner*—Guy J Lamarre
(74) *Attorney, Agent, or Firm*—Lee & Hayes, PLLC (57) ABSTRACT

The present decoding technique provides an efficient technique for decoding linear block codes from multiple encoders. When an error in a code sequence is detected, the decoding technique estimates a confidence for each bit within the code sequence. Based on the confidence, a subset of bits within the code sequence is obtained. The subset of bits is then incrementally flipped to determine a set of modified code sequences. A syndrome is computed for each of the modified code sequences based on a preceding computed syndrome and an update vector.

20 Claims, 5 Drawing Sheets

DECODING TECHNIQUE FOR LINEAR BLOCK CODES

BACKGROUND

Data transmission is the conveyance of any kind of information from one space to another. Inherent with data transmission is the possibility that information may become corrupted once the information is transmitted. Encoding/decoding methods have been developed to detect and correct corrupted data in digital data streams or signals. The encoding method encodes the information to form encoded data. The encoded data is then transmitted over some channel. The decoding method receives the encoded data and decodes the encoded data. In order to accurately decode the encoded data, the decoding method must have the ability to detect and correct errors in the encoded data.

Unfortunately, decoding methods that detect and correct errors are typically quite complex and depend on the type of encoding method that is used to originally encode the information. Therefore, these complex decoding methods are not efficient when implemented on computing devices with limited memory and/or processing capabilities. In addition, for each type of encoded data that the computing device receives, a separate decoding method is needed.

SUMMARY

The present decoding technique provides a universal decoding method that is capable of decoding encoded data from multiple different linear block encoders. When an error in a code sequence is detected, the decoding technique estimates a confidence for each bit within the code sequence. Based on the confidence, a subset of bits within the code sequence is obtained. The subset of bits is then incrementally flipped to determine a corrected codeword which can be used to obtain information.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

Non-limiting and non-exhaustive embodiments are described with reference to the following figures, wherein like reference numerals refer to like parts throughout the various views unless otherwise specified. For convenience, the left-most digit of a component reference number identifies the particular Figure in which the component first appears.

DETAILED DESCRIPTION

The following description is directed at a decoding technique capable of decoding encoded data from different types of encoders. The decoding technique handles linear block codes that contain a manageable set of error bits. The size for the manageable set of error bits may be dependent on the capabilities of the computing device on which the present decoding technique is executed. These and other aspects of the present decoding technique are now described in detail.

Figure 1:
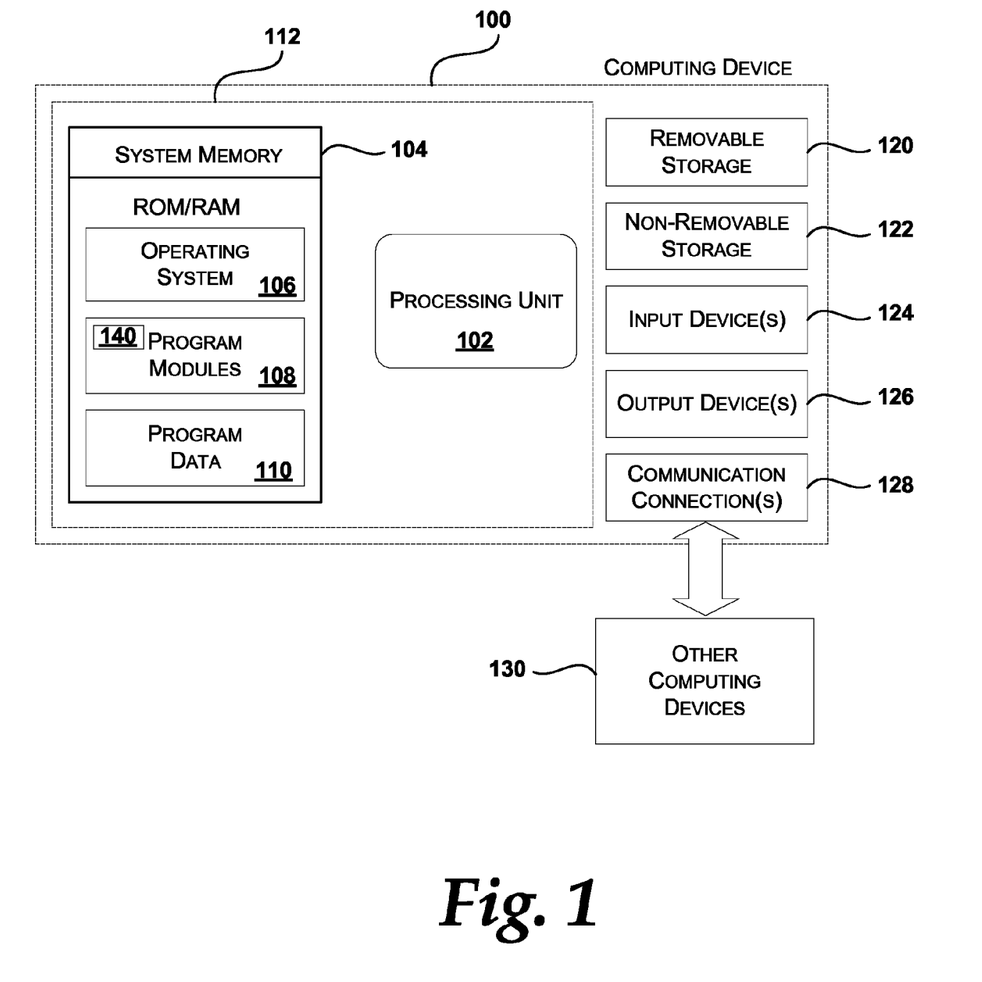
FIG. 1 is an illustrative computing device that may be used to implement the universal decoding technique described herein.

FIG. 1 is an illustrative system that may be used to implement the decoding technique described herein. The system includes a computing device, such as computing device 100. Computing device 100 represents any type of computing device such as a personal computer, a laptop, a server, a game console, a handheld or mobile device (e.g., a cellular phone, digital assistant, cellular camera phone), and the like. In a very basic configuration, computing device 100 typically includes at least one processing unit 102 and system memory 104. Depending on the exact configuration and type of computing device, system memory 104 may be volatile (such as RAM), non-volatile (such as ROM, flash memory, etc.) or some combination of the two. System memory 104 typically includes an operating system 106, one or more program modules 108, and may include program data 110. For the present decoding technique, the program modules 108 may include one or more components 140 for implementing the decoding technique. Alternatively, the operating system 106 may include one or more components for implementing the decoding technique. This basic configuration is illustrated in FIG. 1 by those components within dashed line 112.

Computing device 100 may have additional features or functionality. For example, computing device 100 may also include additional data storage devices (removable and/or non-removable) such as, for example, magnetic disks, optical disks, or tape. Such additional storage is illustrated in FIG. 1 by removable storage 120 and non-removable storage 122. Computer storage media may include volatile and nonvolatile, removable and non-removable media implemented in any method or technology for storage of information, such as computer readable instructions, data structures, program modules, or other data. System memory 104, removable storage 120 and non-removable storage 122 are all examples of computer storage media. Thus, computer storage media is accessible by the computing device 100 and includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information. Any such computer storage media may be part of device 100.

Computing device 100 may also have input device(s) 124 such as keyboard, mouse, pen, voice input device, touch input device, etc. For example, computing device 100 may include a data capture device as an input device. The data capture device may be a digital/electronic still camera, a video camera, a film/photographic scanner, or the like. The data capture device may be configured to capture a single or a sequence of images. The images captured by the data capture device may then be stored as image data within computing device 100 via an appropriate interface, such as USB, IEEE 1394, BLUETOOTH, or the like. Output device(s) 126 such as a display, speakers, printer, etc. may also be included. These devices are well known in the art and are not discussed at length here.

Computing device 100 may also contain communication connections 128 that allow the device to communicate with other computing devices 130, such as over a network. Communication connection(s) 128 is one example of communication media. Communication media may typically be embodied by computer readable instructions, data structures, program modules, or other data in a modulated data signal, such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Computer readable media can be any available media that can be accessed by a computer. By way of example, and not limitation, computer readable media may comprise "computer storage media" and "communications media."

Various modules and techniques may be described herein in the general context of computer-executable instructions, such as program modules, executed by one or more computers or other devices. Generally, program modules include routines, programs, objects, components, data structures, etc. for performing particular tasks or implement particular abstract data types. These program modules and the like may be executed as native code or may be downloaded and executed, such as in a virtual machine or other just-in-time compilation execution environment. Typically, the functionality of the program modules may be combined or distributed as desired in various embodiments. An implementation of these modules and techniques may be stored on or transmitted across some form of computer readable media.

Figure 2:
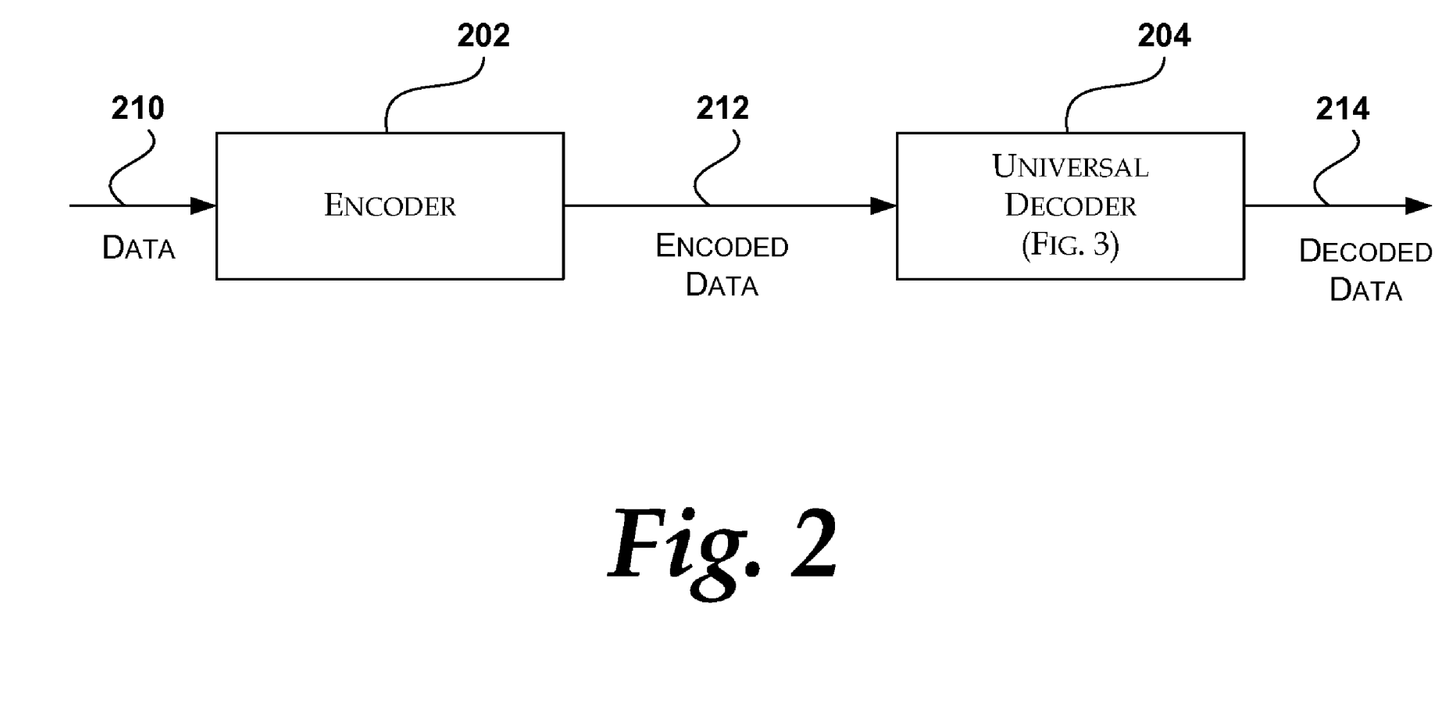
FIG. 2 is a block diagram illustrating an encoder transmitting encoded data to a universal decoder configured to decode the encoded data using the present decoding process, the universal decoder being implemented within the computing device shown in FIG. 1.

FIG. 2 is a block diagram illustrating an encoder 202 transmitting encoded data 212 to a universal decoder 204 that is configured in accordance with the present decoding technique. As mentioned above, encoder 202 may implement one of the various encoding methods on data (e.g., information) 210 that is supplied. For the present application, the encoder 202 implements a linear block code encoding method.

In overview, a linear block code refers to a code in which there are two finite sets: a source alphabet and a code alphabet. The source alphabet may have any number of elements. For example, a binary source alphabet has two elements, such as zero and one. The code alphabet is then unique groupings of a number n of these elements (e.g., 01100011). Each linear block code can be represented as [n,k,d] or simply [n,k], where n is the code length, k is the number of information bits within a codeword, and d is the least Hamming distance between two codewords. Thus, each codeword is n bits in length, contains k bits of information, and differs from another codeword by at least d bits. Extra n−k bits within each codeword are commonly referred to as parity bits and provide error detection and correction ability.

Given that each block is the same n bits in length, there are $A^n$ possible combinations of the elements of the source alphabet A. In other words, each bit within the block can be any one of the elements within the source alphabet. However, because the amount of information in each block is k bits, there are $A^k$ valid codewords. The remaining permutations ($A^n - A^k$) represent invalid codewords. The term "code sequence" is used throughout this discussion to refer to both valid codewords and invalid codewords. If a receiver receives an invalid codeword, the receiver attempts to correct the code sequence into the most likely valid codeword. The most likely valid codeword is the codeword in which the minimum number of bits needs to be modified in order for the invalid code sequence to become a valid codeword.

Because each linear block code may be represented as a k-dimensional subspace of an n-dimensional space, vectors are used to simplify the representation for the codewords. Thus, a vector (i.e., vector c) represents the subspace for the valid codewords of a linear block code. Each codeword is then an element from the set of all the vectors c. As is known to those skilled in the art, each linear block code may be completely defined by a corresponding generator matrix G. The generator matrix G defines the length of each codeword n, the number of information bits k in each codeword, and the type of redundancy that is added for error handling. The generator matrix G is a n×k matrix.

The generator matrix G is multiplied by the k information bits to obtain the corresponding n bit codeword. The generator matrix G may be defined in a manner such that the information bits within the codeword appear in a pre-defined position (e.g., the last bits) within the n bit codeword. This type of resulting code is referred to as a systematic code. Thus, for systematic codes, the information bits are passed into the codeword unchanged and parity bits are added. Alternatively, the generator matrix G may produce a codeword where the information bits are not directly represented within the code. This is called a nonsystematic code. One advantage of systematic codes is that the encoder only needs to produce (n−k) bits instead of having to produce the entire codeword.

Returning to FIG. 2, the encoded data 212 represents the code sequences after the codewords have been transmitted from the encoder 202. As mentioned above, some of these code sequences may be valid codewords and other may have become corrupted during transmission. The code sequences are input into decoder 204. In contrast with traditional decoders, decoder 204 can decode the code sequences encoded from different types of encoders. Briefly, universal decoder 204, described in detail in conjunction with FIG. 3, performs error correction on code sequences that are invalid codewords based on a confidence that is determined for each bit in the code sequence.

Figure 3:
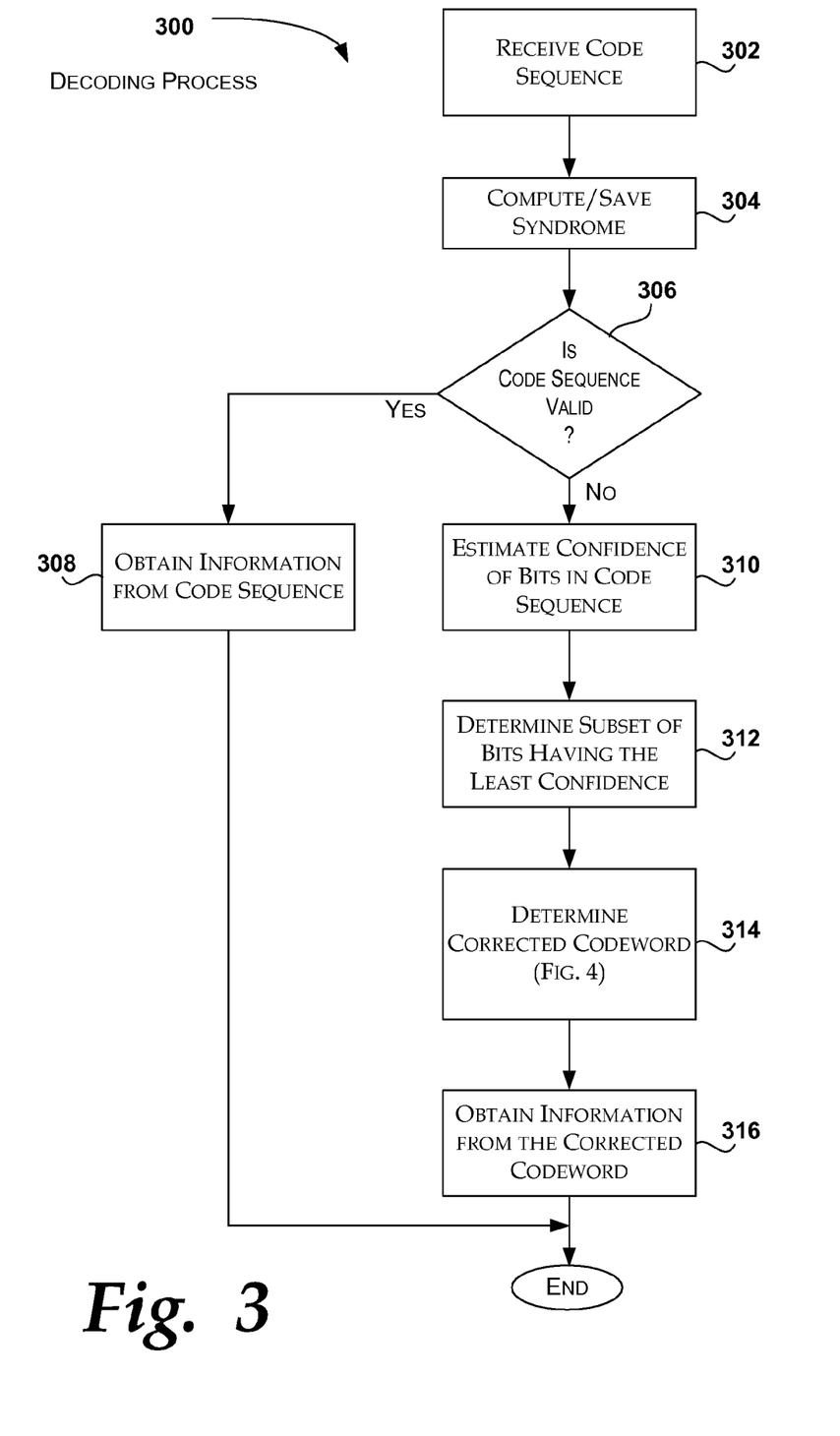
FIG. 3 is a flow diagram illustrating an exemplary decoding process suitable for use in the universal decoder shown in FIG. 2.

FIG. 3 is a flow diagram illustrating an exemplary decoding process suitable for use in the universal decoder shown in FIG. 2. For each linear block encoding process supported by decoding process 300, a corresponding generation matrix G and parity check matrix H is made available to decoding process 300. In addition, the type of encoding that was performed to generate the code sequence is made available to the decoding process 300. For example, the type of encoding may be recognized based on a file extension of the encoded bit stream. Process 300 begins at block 302 where a code sequence within the encoded bit stream is received. As mentioned above, the code sequence may or may not have errors. Process 300 is performed for each code sequence within the encoded bit stream. Processing continues at block 304.

At block 304, a syndrome h for the code sequence is computed and saved. The syndrome h is computed using conventional methods by multiplying the transpose parity check matrix $H^T$ by the received code sequence c. The computed syndrome h is then saved so that, if necessary, it may be used in the processing performed in block 314. Processing continues at decision block 306.

At decision block 306, a determination is made whether the code sequence contains an error. This determination is based on the syndrome calculated in block 304. If the received code sequence is a valid codeword, the syndrome is zero and processing continues at block 308. If the syndrome is not zero, processing continues at block 310. In another embodiment, the valid codewords may be available in a look-up table based on the type of encoding method that was used. For this embodiment, an invalid codeword is determined if the code sequence is not located within the look-up table.

At block 308, information bits are obtained from the code sequence. An arbitrary k linearly independent rows (e.g., $m_1$, $M_2, \ldots, m_k$-th rows) of the generation matrix G are selected to form a square non-degenerative sub-matrix $\tilde{G}$. Using conventional techniques, the square non-degenerative sub-matrix $\tilde{G}$ is then used in solving for the information bits r using $r = \tilde{G}^{-1} \tilde{c}$, where $\tilde{c}$ is the sub-vector of c by selecting the $m_1$, $m_2, \ldots, m_k$-th bits of c. The processing for that code sequence is then complete. The present decoding technique, however, provides a technique for handling non-valid code sequences for different types of linear block encoded data that is not as complex and computationally expensive as decoding techniques specific to an encoding technique. The present decoding technique has obtained successful results for when the number of error bits is small. This technique is now described in conjunction with blocks 310-316.

At block 310, a confidence for each bit within the code sequence is estimated. The estimation of the confidence of each bit is based on a source from where the information bits derived. For example, estimating the confidence of the bit may be based on measuring an intensity of a pixel if the source is an image, a voltage if the source is an electrical signal, or the like. A higher confidence correlates to a higher probability that the bit is correct. For example, assuming the example source is an image where a prefect bit 0 is represented by a white dot and a perfect bit 1 is represented by a black dot. The darker the measurement of the pixel, the higher the confidence that the bit actually represents a 1. Similarly, assuming the example source is an electrical signal where a prefect bit 1 is represented with a one volt voltage and a perfect bit 0 is represented by a zero volt voltage. Then, the higher the voltage, the higher the probability that the bit actually is a value of 1. Conversely, the lower the voltage, the higher the probability that the bit is 0. Once the confidence level of each bit is estimated, processing continues at block 312.

At block 312, a subset c' of the bits having the least confidence is determined. The subset may be any size and may depend on the computational resources available on the computing device performing the decoding process. For one embodiment, the number of bits in the subset c' may be set equal to 12. In another embodiment, the size of the subset may be based on the code's ability of correcting error bits, namely its Hamming distance d. For this embodiment, the size of the subset may equal one plus the Hamming distance d divided by 2 (i.e., (1+d)/2)). However, other values for the subset size may be determined based on the computational resources available on the computing device and on the accuracy of the encoded data. Processing continues at block 314.

At block 314, a "corrected" codeword is determined for the code sequence. The "corrected" codeword may be the same as the original codeword or may be slightly different. Briefly, determining the corrected codeword, described later in detail in conjunction with FIG. 4, incrementally flips the bits within the subset c' and then determines the "corrected" codeword based on which valid result required the least number of flipped bits. Once the "corrected" codeword is determined, processing continues at block 316.

At block 316, information is obtained from the corrected codeword. The information is obtained using the same technique as described above in block 308. However, instead of using the code sequence, the corrected codeword is used. The decoding process 300 is then complete.

Figure 4:
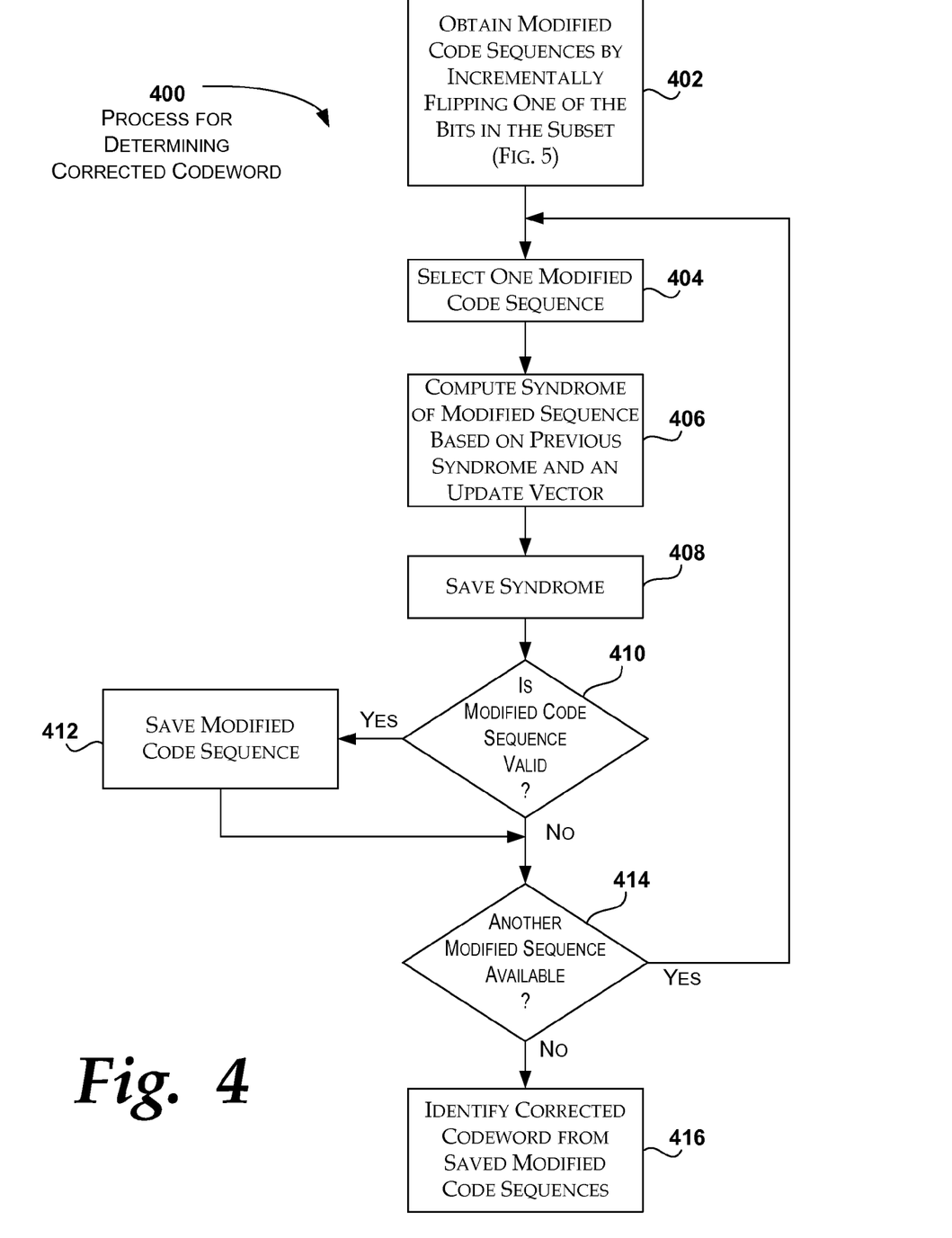
FIG. 4 is a flow diagram illustrating an exemplary process for determining a corrected codeword suitable for use in the flow diagram shown in FIG. 3.

FIG. 4 is a flow diagram illustrating one embodiment for determining the corrected codeword which is suitable for use within the flow diagram of FIG. 3. In overview, process 400 provides an efficient method for determining the most likely corrected codeword by incrementally flipping bits. Before describing process 400, the concept underlying the incremental flipping of bits is first described.

In overview, at a receiver, a decoder may check whether a received code sequence belongs to the code by using a parity check matrix H. As described above, multiplying the transposed parity check matrix $H^T$ by the received code sequence c yields a syndrome h (i.e., $h = H^T c$). If the syndrome h is equal to zero, the received code sequence c is a valid codeword. The inventors discovered that the next syndrome (i.e., $h^{(i+1)}$) can be computed efficiently from the current syndrome (i.e., $h^i$), where the superscripts i and (i+1) indicate the i-th and (i+1)-th choices of bits that are flipped within the subset c'.

Figure 5:
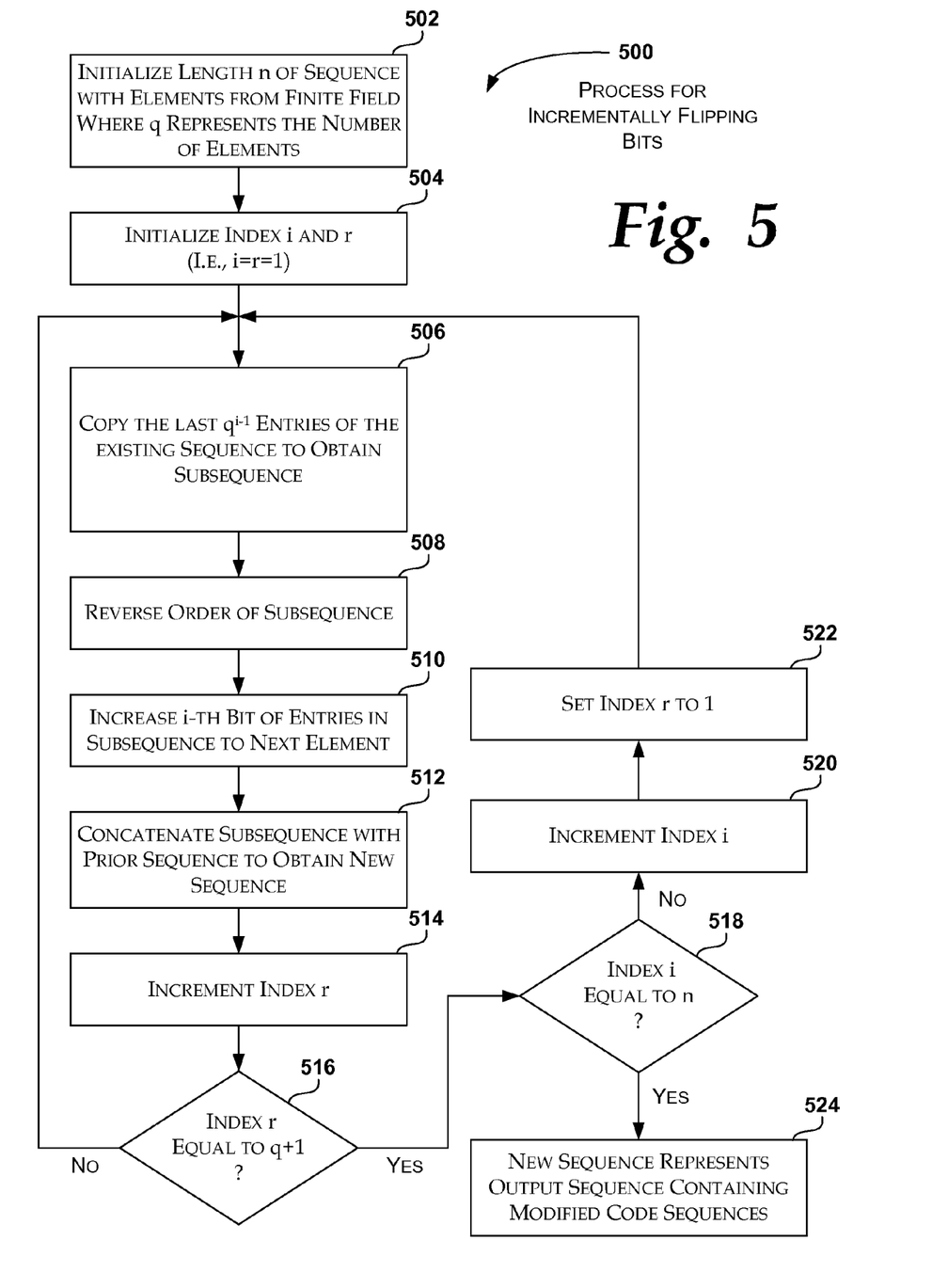
FIG. 5 illustrates an exemplary incremental bit flipping technique suitable for use in the flow diagram shown in FIG. 4.

To further describe this concept, the choice of which bits are flipped within the subset c' having t bits may be denoted in vector notation as $f = (\alpha_1, \alpha_2, \ldots \alpha_t)$. Each bit that can be flipped, $\alpha_j$, is an element of a finite field, such as GF(q) where q represents the number of elements in the finite field. Thus, the $n_j$-th bit of c (i.e., $c_{n_j}$) is changed by $\alpha_j$, where $j = 1, 2, \ldots, t$ and n represents the code length of the code sequence c. Note that if $\alpha_j = 0$, this means that $c_{n_j}$ is not flipped (i.e., changed). Because each of the bits within the subset c' having t bits can be flipped to one of the elements of the finite field, there are a possible $q^t$ arrangements for vector f. These possible arrangements for vector f may take the form of a sequence $f_1, \ldots, f_q$, where $f_i$ and $f_{i+1}$ only differ by one bit. The sequence $f_i$ may be represented as $f_i = (\alpha_1^{(i)}, \alpha_2^{(i)}, \ldots \alpha_t^{(i)})$ and the sequence $f_{i+1}$ may be represented as $f_{i+1} = (\alpha_1^{(i+1)}, \alpha_2^{(i+1)}, \ldots \alpha_t^{(i+1)})$. The difference between $f_i$ and $f_{i+1}$ may then be represented symbolically as $f_{i,i+1}$. FIG. 5 is a flow diagram illustrating an exemplary process 500 for incrementally flipping bits where the finite field GF(q) has elements $\beta_1, \beta_2, \ldots \beta_q$. Each consecutive vector (i.e., modified code sequence) differs by one bit.

For notational brevity, without any loss of generality, the subset c' having t bits may be assumed to have the t bits positioned as the last t bits in the received code sequence c. Then the next syndrome $h^{(i+1)}$ can be derived as follows:

$$h^{(i+1)} = H^T \tilde{c}^{(i+1)} \tag{1}$$

$$h^{(i+1)} = H^T (\tilde{c}^{(i)} + (\bar{f}_{i+1} - \bar{f}_i)) \tag{2}$$

$$h^{(i+1)} = h^{(i)} + H^T (\alpha_{f_{i,i+1}}^{(i+1)} - \alpha_{f_{i,i+1}}^{(i)}) e_{(n-k)+f_{i,i+1}} \tag{3}$$

$$h^{(i+1)} = h^{(i)} + (\alpha_{f_{i,i+1}}^{(i+1)} - \alpha_{f_{i,i+1}}^{(i)}) H^T_{(n-k)+f_{i,i+1}} \tag{4}$$

For the following discussion, the vector $\tilde{c}$ denotes a modified code sequence from the originally received code sequence c. In addition, the vector $\bar{f}$ represents the change vector for the entire modified code sequence in contrast with vector f that represents the change vector for only the bits within the subset c'. The first equation is the definition for a syndrome. The second equation illustrates that the (i+1) modified code sequence (i.e., $\tilde{c}^{(i+1)}$) is equal to the i-th modified code sequence (i.e., $\tilde{c}^{(i)}$) plus the difference between the (i+1)-th and the i-th change vector $\bar{f}$ (i.e. $\bar{f}_{i+1} - \bar{f}_i$). For example, change vector $\bar{f}$ may be represented as follows: $\bar{f}_j = (0, 0, \Lambda, 0, \alpha_1^{(j)}, \alpha_2^{(j)}, \Lambda, \alpha_t^{(j)})$. One will note that because the t least confident bits are positioned as the last t bits in this example, the first bits in the change vector $\bar{f}$ have a value of 0 which represents that they do not undergo any change with respect to the originally received code sequence c.

The third equation illustrates that multiplying the transposed parity check matrix $H^T$ by the current modified code sequence yields a syndrome h (i.e., $h=H^T\tilde{c}^{(i)}$). In addition, the difference between the change vectors $\tilde{f}_{i+1}-\tilde{f}_i$ may be represented as the difference in the one bit that was flipped (i.e., $\alpha_{f_{i,i+1}}^{(i+1)}-\alpha_{f_{i,i+1}}^{(i)}$) and vector $e_s$ whose entries are all 0's except the s-th entry which is a 1. One will note that the index s for vector $e_s$ is determined by taking the code length n subtracting the message bits k and adding the bit position associated with the bit that was flipped.

The fourth equation illustrates that the vector $e_s$ multiplied by the transposed parity check matrix $H^T$ yields the s-th column of matrix $H^T$ (i.e., the s-th row of matrix H). The last term in equation 4 represents as an update vector. Thus, the next syndrome can be updated from the current syndrome by adding the update vector. This requires one scalar-vector multiplication and one vector-vector addition. In comparison, if the next syndrome is not computed incrementally, but rather computed from using the next code sequence directly (i.e., $h^{(i+1)}=H^T\tilde{c}^{(i+1)}$), then $\tilde{m}^{(i+1)}$ scalar-vector multiplication and $\tilde{n}^{(i+1)}-1$ vector-vector additions are required, where $\tilde{m}^{(i+1)}$ is the number of entries of $\tilde{c}^{(i+1)}$ that are neither 0 nor 1, and $\tilde{n}^{(i+1)}$ is the number of non-zero entries of $\tilde{c}^{(i+1)}$. Therefore, the present bit flipping technique is much more efficient than a brute-force approach.

As a special case, the above decoding process is particularly efficient when the source alphabet has two elements (i.e., q=2). In this case, the code is binary. The next syndrome may then be calculated as follows:

$$h^{(i+1)}=h^{(i)}+H^T_{(n-k)+f_{i,i+1}}. \quad (5)$$

One will note that this requires no multiplication over the finite field GF(2), and the addition is simply the XOR (eXclusive OR). Therefore, the computation is very efficient on computers.

Given the above explanation, process 400 illustrated in FIG. 4 is now described. Process 400 begins at block 402 where modified code sequences are obtained by incrementally flipping one of the bits within the subset. As described above, any one of the bits may be flipped to create a new modified code sequence. Typically, it is advantageous to flip one of the bits within the subset c' in a systematic manner until all of the bits have been flipped, such as illustrated in FIG. 5. One will note that "flipping" refers to changing one of the bits to one of the elements in the source alphabet. Therefore, flipping does not limit the number of changes of a bit to two, but rather is limited by the number of elements q within the source alphabet. Processing continues at block 404.

At block 404, one of the modified code sequences generated in block 402 is selected. Processing continues at block 406.

At block 406, a syndrome for the modified code sequence is computed using equation (4) or (2) described above, depending on the number of elements within the source alphabet. Thus, as described, the syndrome for the modified code sequence is computed based on the previous syndrome and an update vector. One will note that for the first pass, the syndrome computed in block 304 is used as the previous syndrome. Thereafter, the syndrome is saved at block 408 and used in the computation of block 406. Processing proceeds from block 406 to block 408 and then to block decision block 410.

At decision block 410, a determination is made whether the modified code sequence is valid. Again, this determination is based on the computed syndrome. If the syndrome is a value of zero, this indicates that the modified code sequence is valid and processing continues at block 412. At block 412, the modified code sequence is saved. Processing continues at decision block 414 same as if the modified code sequence was not valid.

At decision block 414, a determination is made whether another modified code sequence is available. If there is another modified code sequence, processing loops back to block 404 and continues as described above. However, once all the modified code sequences for the code sequence have been checked, processing continues at block 416.

At block 416, a corrected codeword is identified from the saved modified code sequences. The corrected codeword is determined to be the modified code sequence with the fewest number of bits changed from the originally received code sequence. If two or more modified sequences have the same number of bits that were changed, other criteria may be used to determine the corrected codeword, such as the distance between the changed bits or the like. Once the corrected codeword is determined, processing returns to FIG. 3.

FIG. 5 illustrates an exemplary incremental bit flipping technique suitable for use in the flow diagram shown in FIG. 4. For convenience, process 500 assumes that the subset of bits which are to be incrementally flipped occur sequentially. Therefore, the additional logic that identifies which bits within the code sequence are within the subset is not included in FIG. 5. However, one skilled in the art can easily add the necessary logic so that the bits within the subset are located anywhere within the code sequence and do not necessarily need to be sequential bits. In addition, for further convenience, an example sequence is described where the number n of elements in the subset equals 3 and the number q of elements within the finite set is 2 (e.g., 0 and 1). Processing begins at block 502.

At block 502, a sequence of length n is initialized with elements from a finite field. For example, sequence $S_{1,1}$ may be initialized to $\{(0,0,0)\}$. Processing continues at block 504 where index i and r are both initialized to a value of 1. Processing continues at block 506.

At block 506, a subsequence $\overline{S}_{1,1}$ is obtained by copying entries from the prior sequence $S_{1,1}$. The number of entries that are copied is based on the number of elements q and on index i, such that $q^{i-1}$ entries are copied. For our example, this yields $\overline{S}_{1,1}=\{(0,0,0)\}$. Processing continues at block 508.

At block 508, the order of the modified code sequences within the subsequence are reversed. Because there is currently one modified code sequence in the subsequence, reversing the subsequence does not affect the subsequence at this time. Processing continues at block 510.

At block 510, the i-th bit of entries in the subsequence are incremented to the next element in the finite field. Continuing with our example, the finite field has two elements: 0 and 1. Thus, this yields $\overline{S}_{1,1}=\{(1,0,0)\}$. Processing continues at block 512.

At block 512, the subsequence and prior sequence are concatenated to obtain a new sequence. Continuing with our example, $S_{1,1} \oplus \overline{S}_{1,1}=\{(0,0,0),(1,0,0)\}$, which becomes the new sequence. Here $\oplus$ represents the concatenation operation. Processing continues at block 514 where index r is incremented and then to decision block 516.

At decision block 516, a determination is made whether index r equals q+1. In other words, blocks 506-514 are performed so that each location in the sequence may be "flipped" to one of the elements in the finite set. Because the number of elements in our example finite set equals 2, processing continues at decision block 518 instead.

At decision block 518, a determination is made whether index i equals n. When this is true, this means that blocks 506-514 have been performed for each location within the sequence. Processing continues at block 524. However, until each location within the sequence has been flipped, processing continues to block 520 where index i is incremented and to block 522 where index r is set back to 1. Processing then continues through blocks 506-516 as described above.

Once each location with the sequence has been incrementally flipped with each of the elements in the finite field, the resulting sequence represents an output sequence that contains the modified code sequences (block 524). Each of these modified code sequences is then analyzed to determine the "correct" modified code sequence in accordance with process 400 shown in FIG. 4. Continuing with our example, process 500 yields {(0,0,0),(1,0,0),(1,1,0),(0,1,0),(0,1,1),(1,1,1),(1,0,1),(0,0,1)} for the output sequence. When q=3 and n=3, process 500 yields the following output sequence:

(0,0,0),(1,0,0),(2,0,0),(2,1,0),(1,1,0),(0,1,0),(0,2,0),
(1,2,0),(2,2,0),(2,2,1),(1,2,1),(0,2,1),(0,1,1),(1,1,1),
(2,1,1),(2,0,1), (1,0,1),(0,0,1), (0,0,2),(1,0,2),(2,0,2),(2,1,2),(1,1,2),(0,1,2), (0,2,2),(1,2,2),(2,2,2).

The above described decoding process may be implemented in several different types of computing devices and for several different types of applications. It is envisioned that the above decoding process may be implemented within a camera phone that captures a 2D bar code. The camera phone can use the above described decoding method to decode the embedded information within the 2D bar code and/or look up additional information via a network. The 2D bar code may be an identification code, such as for identifying audios and videos.

While example embodiments and applications have been illustrated and described, it is to be understood that the invention is not limited to the precise configurations and resources described above. Various modifications, changes, and variations apparent to those skilled in the art may be made in the arrangement, operation, and details of the disclosed embodiments herein without departing from the scope of the claimed invention.

What is claimed is:

1. A method that when executed by a computing device decodes linear block code sequences, the method comprising:
   receiving a code sequence;
   computing a syndrome for the code sequence;
   determining whether the code sequence represents one of a plurality of valid codewords based on the syndrome;
   if the code sequence does not represent one of the valid codewords:
   estimating a confidence for a plurality of bits within the code sequence;
   determining a subset of the plurality of bits having the least confidence based on the estimated confidence;
   determining a corrected codeword for the code sequence by obtaining a set of modified code sequences and identifying one modified code sequence within the set as the corrected codeword, wherein the obtaining a set of modified code sequences further comprises:
   initializing a sequence $S_{1,1}$ of length n with elements from a finite field;
   initializing an index i and an index r each to a value of 1;
   obtaining a subsequence $\overline{S}_{1,1}$ by copying entries from the sequence $S_{1,1}$, wherein the sequence $\overline{S}_{1,1}$ defines a prior sequence;
   reversing an order of the modified code sequences within the subsequence $\overline{S}_{1,1}$;
   incrementing an i-th bit of entries in the subsequence to a next element in the finite field to yield $\overline{S}_{1,1}$;
   concatenating the subsequence and the prior sequence to obtain a new sequence;
   incrementing index r;
   when index r equals q+1, wherein q is the number of elements:
   determining when index i is equal to n, and when index i is equal to n, completing the output sequence containing the modified code sequences;
   when index i is not equal to n, incrementing index i, setting index r to 1, and returning to obtaining a subsequence $\overline{S}_{1,1}$ by copying entries; and
   when index r is not equal to q+1, returning to obtaining a subsequence $\overline{S}_{1,1}$ by copying entries; and
   obtaining information from the corrected codeword.

2. The method of claim 1, wherein a number of bits for the subset is based on a Hamming distance associated with the code sequence.

3. The method of claim 1, wherein a number of bits for the subset is based on computational resources available on the computing device.

4. The method of claim 1, wherein the confidence estimated for one bit is based on a pixel intensity calculated for the one bit.

5. The method of claim 1, wherein the confidence estimated for one bit is based on a voltage level calculated for the one bit.

6. The method of claim 1, wherein determining the corrected codeword further comprises computing a syndrome for each modified code sequence based on a prior computed syndrome and an update vector.

7. The method of claim 6, wherein computing the syndrome comprises performing a scalar-vector multiplication and a vector-vector addition.

8. The method of claim 6, wherein computing the syndrome comprises adding the prior computed syndrome with a column of a transposed parity check matrix associated with the received code sequence.

9. The method of claim 6, wherein the update vector comprises a column of a transposed parity check matrix associated with the received code sequence multiplied by a change vector representing a difference between a current modified code sequence and a preceding code sequence.

10. The method of claim 1, wherein identifying one modified code sequence within the set as the corrected codeword comprises identifying the one modified code sequence that has the fewest bits flipped with respect to the received code sequence in comparison with the other modified code sequences and wherein the one modified code sequence and the other modified code sequences represent valid codewords.

11. A computer-readable storage media having computer-executable instructions for decoding a code sequence, the instructions, when executed by a computing device, performing a method comprising:
   incrementally flipping a subset of bits out of a plurality of bits within the code sequence if the code sequence is not one of a plurality of valid codewords, wherein each incremental flip yields one of a plurality of modified code sequences, wherein the flipping comprises:
   initializing a sequence $S_{1,1}$ of length n with elements from a finite field;
   initializing an index i and an index r each to a value of 1;
   obtaining a subsequence $\overline{S}_{1,1}$ by copying entries from the sequence $S_{1,1}$, wherein the sequence $\overline{S}_{1,1}$ defines a prior sequence;
   reversing an order of the modified code sequences within the subsequence $\overline{S}_{1,1}$;

incrementing an i-th bit of entries in the subsequence to a next element in the finite field to yield $\overline{S}_{1,1}$;

concatenating the subsequence and the prior sequence to obtain a new sequence;

incrementing index r;

when index r equals q+1, wherein q is the number of elements:

determining when index i is equal to n, and when index i is equal to n, completing the output sequence containing the modified code sequences;

when index i is not equal to n, incrementing index i, setting index r to 1, and returning to obtaining a subsequence $\overline{S}_{1,1}$ by copying entries; and when index r is not equal to q+1, returning to obtaining a subsequence $\overline{S}_{1,1}$ by copying entries for each modified code sequence, saving the modified code sequence if a syndrome associated with the modified code sequence indicates that the modified code sequence is one of the plurality of valid codewords, the syndrome being computed by adding an update vector to a prior syndrome computed for a preceding code sequence;

identifying a corrected codeword from the modified code sequences that were saved; and obtaining information from the corrected codeword.

12. The computer-readable storage media of claim 11, wherein identifying the corrected codeword comprises comparing a number of bits that were flipped for each of the saved modified code sequences in comparison with the code sequence and selecting the modified code sequence having the fewest bits flipped as the corrected codeword.

13. The computer-readable storage media of claim 11, wherein the code sequence represents a linear block code.

14. The computer-readable storage media of claim 11, wherein evaluating the corresponding syndrome comprises performing a scalar-vector multiplication and a vector-vector addition.

15. The computer-readable storage media of claim 11, wherein the preceding code sequence comprises the code sequence.

16. The computer-readable storage media of claim 11, wherein the preceding code sequence comprises one of the modified code sequences.

17. A computing device, comprising:

a processor;

a memory into which a plurality of instructions are loaded, wherein upon execution of the plurality of instructions by the processor, the system being configured to:

receive an encoded bit stream, the bit stream comprising a plurality of code sequences;

obtain a plurality of information bits within each code sequence representing a valid codeword; and obtain another plurality of information bits within each code sequence representing a non-valid codeword, the other plurality of information bits being obtained by estimating a confidence for a plurality of bits within the code sequence to determine a subset of the plurality of bits, wherein the subset is incrementally flipped to obtain a set of modified code sequences, one modified code sequence of the set is selected as a corrected codeword and used to obtain the other plurality of information bits, wherein the incremental flipping comprises:

initializing a sequence $S_{1,1}$ of length n with elements from a finite field;

initializing an index i and an index r each to a value of 1;

obtaining a subsequence $\overline{S}_{1,1}$ by copying entries from the sequence $S_{1,1}$ wherein the sequence $\overline{S}_{1,1}$ defines a prior sequence;

reversing an order of the modified code sequences within the subsequence $\overline{S}_{1,1}$;

incrementing an i-th bit of entries in the subsequence to a next element in the finite field to yield $\overline{S}_{1,1}$;

concatenating the subsequence and the prior sequence to obtain a new sequence;

incrementing index r;

when index r equals q+1, wherein q is the number of elements:

determining when index i is equal to n, and when index i is equal to n, completing the output sequence containing the modified code sequences;

when index i is not equal to n, incrementing index i, setting index r to 1, and returning to obtaining a subsequence $\overline{S}_{1,1}$ by copying entries; and when index r is not equal to q+1, returning to obtaining a subsequence $\overline{S}_{1,1}$ by copying entries.

18. The computing device of claim 17, wherein the corrected codeword comprises one of the modified code sequences from the set that represents a valid codeword after flipping.

19. The computing device of claim 18, wherein the corrected codeword comprises the one modified code sequence out of the set that flipped the fewest bits with respect to the code sequence representing the non-valid codeword.

20. The computing device of claim 17, being further configured to: compute a syndrome for the modified code sequences based on a preceding modified code sequence and a change vector.

* * * * *